Nov. 6, 1962 H. O. McMAHON 3,062,968

ELECTRIC CURRENT CONTROL CIRCUIT

Filed July 2, 1958

Inventor
Howard O. McMahon
by Roberts, Cushman & Grover
Att'ys

United States Patent Office 3,062,968
Patented Nov. 6, 1962

3,062,968

ELECTRIC CURRENT CONTROL CIRCUIT

Howard O. McMahon, Lexington, Mass., assignor to Arthur D. Little, Inc., Cambridge, Mass., a corporation of Massachusetts Filed July 2, 1958, Ser. No. 746,246
3 Claims. (Cl. 307—88.5)

This invention relates to a circuit for controlling electrical current and particularly to a superconductive circuit of the general class shown in an article entitled The Cryotron, D. A. Buck, Proceedings of the I.R.E., April 1956, pages 482 to 493.

The cryotron involves the phenomenon that certain elements, alloys and compounds, when cooled below a critical temperature, assume a superconducting or zero resistance state in the absence of a predetermined magnetic field. If a field above the predetermined value is applied to a superconductive material, it changes from superconducting to resistive state. Thus a length of superconductor, with which is associated an inductance for applying a field to the wire, acts as a gate alternatively offering zero or a finite resistance to current. If an alternative superconducting path is offered, current will be diverted from the resistive to the superconducting path. Herein the terms superconductor or superconductive designate the capacity of a body to change between the abovementioned states, while the terms superconducting or superconduction designate the zero resistance state.

D. A. Buck has described various circuits utilizing the cryotron gate and control, more particularly flip-flop circuits having an output control or gate which indicates the condition of the flip-flop by the presence or absence of current in the output The object of the present invention is to provide a circuit whose condition is indicated by the direction of current in the output.

According to the invention such a circuit comprises a superconductor, current-supply and current-collection means, means including superconductive supply gates providing alternate paths from said current-supply means to opposite ends of said superconductor, means including superconductive collection gates providing alternate paths from opposite ends of said superconductor to said current-collection means, and control means for applying a magnetic field to respective gates to change the respective gates from a zero resistance state to a state of finite resistance, whereby when the control means for a first pair of supply and collection gates respectively at opposite ends of said superconductor changes said first pair of gates to finite resistance state all current flows through the other pair of gates and through said superconductor in one direction, and when the control means for the second pair of gates changes said second pair of gates to finite resistance state all current flows through said superconductor in the reverse direction.

Further according to the invention the control means for the first and second pairs of gates respectively are connected to the current conducting output means of a flip-flop.

Still further according to the invention, the circuit comprises means for detecting the direction of current in the aforesaid superconductor.

For the purpose of illustration typical embodiments of the invention are shown in the accompanying drawing in which FIG. 1 is a schematic diagram of a current reversing circuit;

Figure 1:
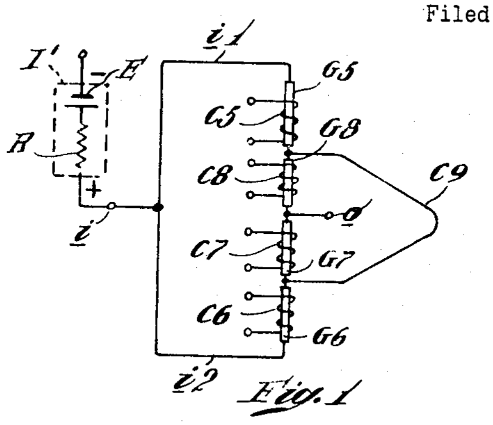

As shown in FIG. 1 the current reversing circuit has an input terminal *i* connected through alternate paths *i*1 and *i*2 to superconductive gates G5 and G6. The gates G5 and G6 are connected respectively through gates G8 and G7 to a current output terminal *o*. A superconductor C9 is connected between the junction of gates G5 and G8 and the junction of G6 and G7. A constant current source I' is connected to the current supply terminal *i*, and is connected directly or indirectly to the output terminal *o*. A typical constant current source is a voltage supply E and a series resistor R whose resistance is so large in proportion to the resistance of the circuit between the current terminals *i* and *o* that variation in the resistance of the circuit will not appreciably effect the total resistance or current flowing. Wound on each of the gates G5 to G8 are corresponding control coils C5, C6, C7 and C8. Typically each gate comprises a tantalum core, 0.009 inch in diameter having an insulating coating approximately 0.0005 inch thick. On the insulation are closely wound one to two hundred turns of niobium wire 0.003 inch in diameter.

In the absence of current in the control coil, primary current will split approximately equally between the conductors *i*1 and *i*2 and flow to the current-collection terminal *o*, assuming all the gates are held below the critical temperature at which they change from finite resistance to zero resistance state, and assuming that the conductor C9 is a tantalum wire also held in superconducting state, for example by emerging in a bath of liquid helium. Then if current is supplied to control coils C5 and C7 sufficient to apply a magnetic field to their respective gates G5 and G7 to raise the gates from zero resistance to finite resistance state, a zero resistance path will exist through gate G6, superconductor C9 and gate G8 to the current-collection terminal *o*.

In this case current will be flowing upwardly through the superconductor C9 as illustrated. On the other hand if the gates G6 and G8 are quenched or raised to resistance state by greater than critical current in their respective control coils C6 and C8, then a superconducting path from conductor *i*1 will exist through gate G5, superconductor C9 and gate G7 to the current-collection terminal *o*. In this case current will flow down through the superconductor C9. Thus, by the described control of the gates, current through the superconductor C9 has been reversed. For convenience the gates G5 and G6 may be called supply gates and the gates G7 and G8 may be called collection gates. Further for convenience the gates G5 and G7 may be called a pair of gates connected at opposite ends of the superconductor C9 . Gates G6 and G8 form a like pair of gates. When control is shifted from one pair of gates to the other, the direction of current through the superconductor C9 is reversed.

It will be apparent that the current-collection and current-supply terminals are interchangeable as are the collection and the supply gates, depending solely on the polarity of the current source.

Figure 2:
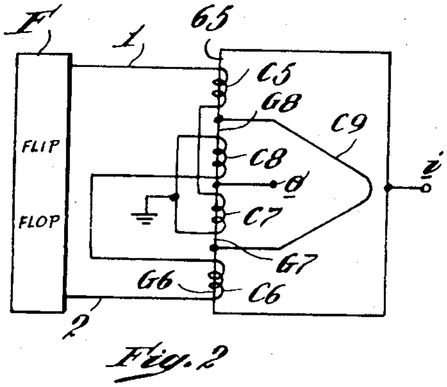
FIG. 2 is a schematic diagram showing flip-flop control of the current reversing circuit of FIG. 1.

In FIG. 2, the current reversing circuit of FIG. 1 is shown controlled by a flip-flop F having output conductors 1 and 2. As is conventional with such flip-flops, current flows alternatively through only one of the output conductors 1 and 2. When current is flowing in output conductor 1, control coils C5 and C7 quench gates G5 and G8 resulting in current flow upwardly through superconductor C9. On the other hand, when current is flowing in the flip-flop output conductor 2 and control coils C6 and C8, current flows downwardly through the superconductor C9.

Figure 3:
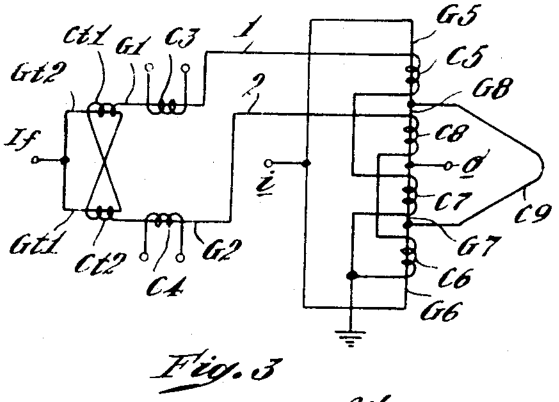

A typical superconductive flip-flop is shown in FIG. 3 connected to the above described current reversing circuit. In this circuit flip-flop current can flow from the current supply terminal I*f* along two paths to the output conductors 1 and 2. One path is through a transfer gate G*t*1, a transfer coil C*t*1, and a set gate G1 to the conductor 1. The alternate path is through a transfer gate G*t*2, a transfer coil C*t*2, and a set gate G2 to the output conductor 2. Set control coils C3 and C4 respectively are disposed to control the gates G1 and G2. It will be understood that the set control coils C3 and C4 may be disposed anywhere in the path through gates G*t*1 and G*t*2 respectively, and in fact may control these gates directly. In any case, if control current is supplied to either of the set coils, a part of the path will be quenched. For example, if current is applied to set coil C3, the current path through gate G*t*1 will be quenched and at least partly raised to resistive state. Flip-flop current being presented with an alternative superconducting or zero resistance path through gates G*t*2 and G2 will be wholly diverted to this second path. Current flowing through the second path flows through the transfer coil C*t*2 embracing the transfer gate G*t*1, holding this latter gate quenched with a regenerative action after said current is removed from the set coil C3, and the flip-flop will be established in a stable condition with current flowing through its output conductor C2. Since the control coils C6 and C8 in series with the output conductor 2 control the direction of current through superconductor C9. it is apparent that stable condition of the flip-flop stably maintains the direction of current through superconductor C9.

Figure 4:
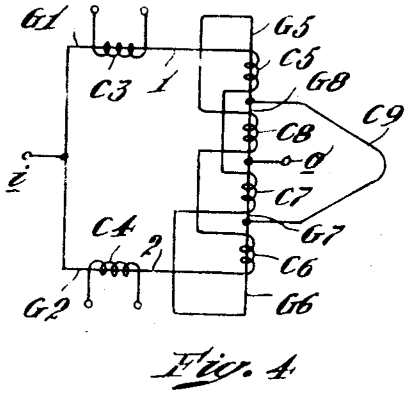
FIGS. 3 and 4 are schematic diagrams showing alternate forms of flip-flops controlling the current reversing circuit.
Figure 5:
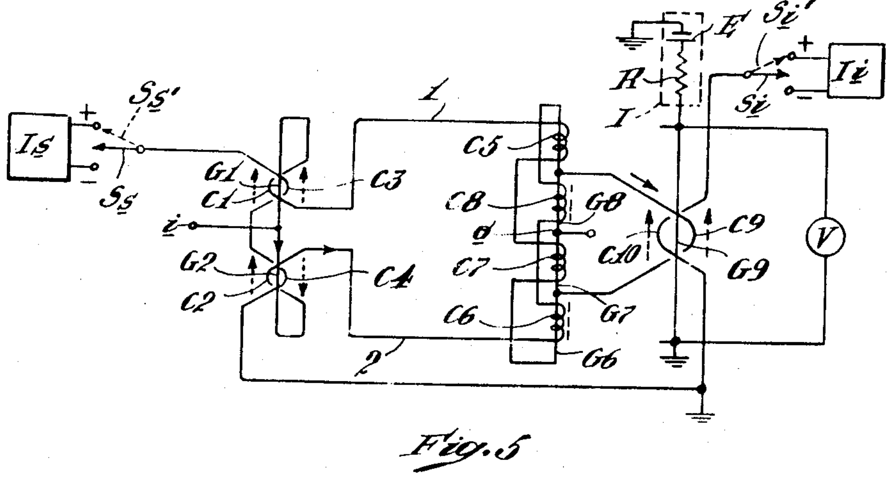
FIG. 5 is a schematic diagram showing means for detecting current direction.

It should be understood that the flip-flop output conductors 1 and 2, and in fact all parts of the circuit of FIGS. 3 to 5 are superconductive, although not necessarily in superconducting state.

In FIG. 4 is shown a circuit wherein the transfer or regenerative function of the transfer gates and coils of FIG. 3 are combined with the current reversing function. Also in this circuit the current between the terminals *i* and *o* is used both for the flip-flop and the current reversing circuit. Such current has a choice of alternate paths through gates G1 and G2 and the corresponding flip-flop output conductors 1 and 2 respectively. Conductor 1 is connected through coils C5 and C7 and gate G6 to the collection terminal *o*. Similarly conductor 2 is connected through coils C6 and C8 and the gate G5 to the current-collection terminal *o*. Current may be set in either one of the output conductors 1 or 2 by applying set current to coils C3 or C4. For example, if set current is momentarily applied to coil C3, thereby impeding current through gate G1, all current will be diverted to gate G2 and thence through coil C6. Current through coil C6 quenches gates G6 thereby further impeding the path through gate G1. Thus when set current is removed from coil C3 restoring gate G1 to zero resistance state, there still remains the impedance of gate G6 in series with gate G1 and conductor 1. Thus the current through conductor 1 and coil C6 maintains the current diversion established by set coil C3 as well as the direction of current through the superconductor C9.

As shown in FIG. 5, the current supply terminal *i* is connected to set gates G1 and G2. These gates in turn are connected to bias coils C1 and C2 respectively wound upon the set gates G1 and G2. The set coils are wound so as to apply greater than half but less than the critical magnetic field necessary to cause transition of their respective gates to resistance state. The field supplied by the bias coils is supplemented by applying current to set coils C3 and C4 also wound on the set gates G1 and G2 respectively. As indicated by broken line arrows the field applied to gates G1 and G2 by bias coils C1 and C2 respectively have moments in the same sense. However a set switch S*s* is capable of applying current of negative or positive polarity from a supply of set currents I*s* to the set coils C3 and C4. These coils are so wound as to apply magnetic moments to the gates G1 and G2 one of which opposes the magnetic moment applied by the respective bias coil. For example if the set switch is in position S*s*′ as shown in broken lines, thereby connecting the positive terminal to the set coils C3 and C4, set coil C3 will apply to its gate G1 a field whose magnetic moment reinforces that of the bias coil C1. Concurrently set coil C4 will apply a magnetic moment which opposes the moment applied by the bias coil C2. The reinforced field applied to gate G1 will be sufficient to quench this gate; while the opposing fields applied to gate G2 leave the latter superconducting. For this purpose, the set current supply I*s* and the set coils C3 and C4 are selected to supply a field preferably greater than one half that but less than critical field for gates G1 and G2. It will be understood that various values of primary current and set current may be selected with respect to the coils C1, C2, C3 and C4, so long as any one coil cannot supply a field greater than critical while any two coils can supply a field greater than critical if their respective fields reinforce each other.

In any case it will be evident that control of the bias input gates G1 and G2 establish flip-flop current in either conductor 1 or conductor 2, and as previously described the direction of current through the superconductor C9.

Similarly as with gates G1 and G2, the superconductor C9 applies a magnetic moment to an output gate G9 connected to a constant current source in series with a voltmeter V. A second control coil C10 for the gate G9 is connected through an interrogation switch S*i* to a source of interrogation current I*i* providing positive and negative polarities. Depending on the direction of current through the superconductor C9 and the polarity of current applied to the interrogation coil C10, opposing or reinforcing fields will be applied to the output gate G9. If the fields reinforce and the currents and specifications for the coils C9 and C10 are selected as with gates G1 and G2, reinforcing fields will quench the output gate G9, and opposing fields will leave it superconducting. If the gate is resistive, an IR drop will appear across the voltmeter V which will then indicate the direction of current through superconductor C9.

For example with the set switch in position S*s*′ and flip flop current established through conductor 2 and coils 6 and 8, current will be established downwardly through the superconductor C9 and produce a field indicated by the upwardly directed broken line arrow adjacent coil C9. Further if the interrogation switch is set in the broken line position S*i*′ as shown current through the interrogation coil C10 will apply a reinforcing field indicated by the broken line arrow adjacent coil C10, thereby causing a deflection of the voltmeter. This deflection in accompaniment with the application of current of positive polarity to the coil C10 serves to indicate the downward current in the superconductor C9 as shown by the solid arrow. If interrogation with current of positive polarity failed to produce a deflection, upward current through the superconductor C9 would be indicated. Or if the interrogation current of negative polarity had been applied while current was flowing upward through the superconductor, a voltmeter deflection would be observed. A number of output gates G9 and interrogation coils C10 may be connected respectively in series so as to be interrogated by one interrogation current and to affect a single indicator.

It will be understood that the set switch S*s* and the interrogation switch S*i*, while shown as simple, single throw, double pole switches or keys, may be replaced by any equivalent electronic or superconductive switching means.

Thus, this disclosure is for the purpose of illustration only, and the present invention includes all modifications and equivalents within the scope of the appended claims.

I claim:

1. An electrical circuit comprising current-supply means and current-collection means, superconductive means forming two, alternate current paths between said current-supply and current-collection means, each said path including in series an input cryotron gate responsive to a magnetic input signal, two cryotron magnetic field applying controls, a current-supply and a current-collection gate, the cryotron controls in each path respectively controlling a pair of gates comprising the current-supply gate of one path and the current-collection gate of the other path, the current-supply and current-collection gate of each path having a common junction, and an output superconductor connected between said common junctions, whereby when the input cryotron gate in one path conducts current the pair of gates responsive to the controls in said path is caused to be resistive and the current flows through the other said pair of gates and through said output superconductor in one direction, whereas when the input cryotron gate in the other path conducts current said current flows through the output superconductor in the opposite direction, the flow of current in either path causing the current-supply gate of the other path to be resistive thereby to block current through the other path.

2. The electrical circuit according to claim 1 in combination with means for detecting the direction of current in said output superconductor.

3. The electrical circuit of claim 2 wherein said detecting means comprises an output cryotron gate in the field of said conductor and a control for said output gate which reinforces the field of said output superconductor when current flows through the output superconductor in one direction, and oppose the output superconductor field when current therethrough is reversed.

References Cited in the file of this patent

UNITED STATES PATENTS

| | | |
|---|---|---|
| 2,832,897 | Buck | Apr. 29, 1958 |
| 2,838,675 | Wanlass | June 10, 1958 |
| 2,936,435 | Buck | May 10, 1960 |

OTHER REFERENCES

"A Cryotron—A Superconductive Computer Component" by Buck, "Proceedings of IRE," April 1956, pp. 482 to 493.

"A Cryotron Catalog Memory System" by Slade and McMahon, "Proceedings of Eastern Joint Computer Conference," published June 1957, pp. 115 to 120.